United States Patent [19]

Tanaka et al.

[11] 4,390,800

[45] Jun. 28, 1983

[54] ELECTRET DEVICE

[75] Inventors: Masamichi Tanaka, Yamato; Hiroto Wada, Yokosuka, both of Japan

[73] Assignee: Tokyo Shibaura Denki Kabushiki Kaisha, Japan

[21] Appl. No.: 280,052

[22] Filed: Jun. 30, 1981

[30] Foreign Application Priority Data

Jun. 30, 1980 [JP] Japan .................................. 55-88780
Jun. 30, 1980 [JP] Japan .................................. 55-88782
Jun. 30, 1980 [JP] Japan .................................. 55-88816

[51] Int. Cl.³ ............................................ G11C 13/02
[52] U.S. Cl. .................................................... 307/400
[58] Field of Search ......................... 307/400; 365/146; 29/592 E; 361/233

[56] References Cited

U.S. PATENT DOCUMENTS 3,436,492 4/1969 Reedyk .............................. 307/400
3,967,027 6/1976 Igarashi et al. ..................... 307/400

Primary Examiner—James W. Moffitt
Attorney, Agent, or Firm—Finnegan, Henderson, Farabow, Garrett & Dunner

[57] ABSTRACT

An electret device having an improved surface charge in terms of high potential and uniformity of charge distribution. The electret device comprises a plurality of electret elements formed in stacked layers upon each other, wherein at least the electret element located at the bottom layer is provided with a conductive electrode secured to the bottom surface of a dielectric body, and wherein each electret element is provided with a volume of surface charge of a single polarity.

4 Claims, 6 Drawing Figures

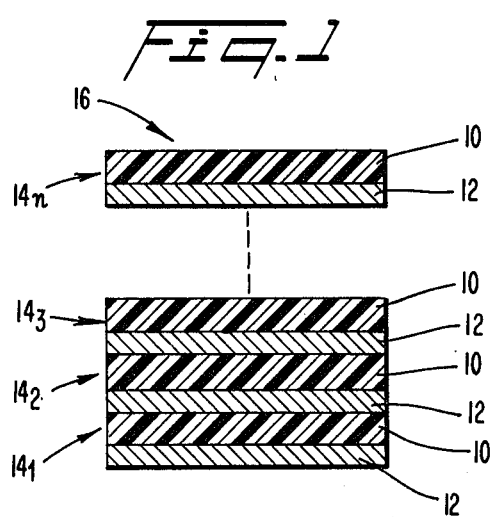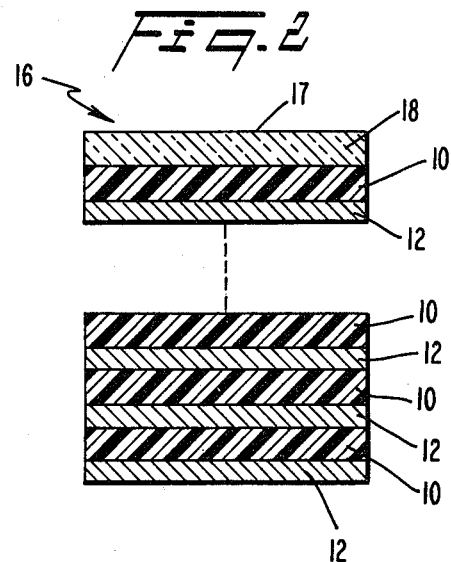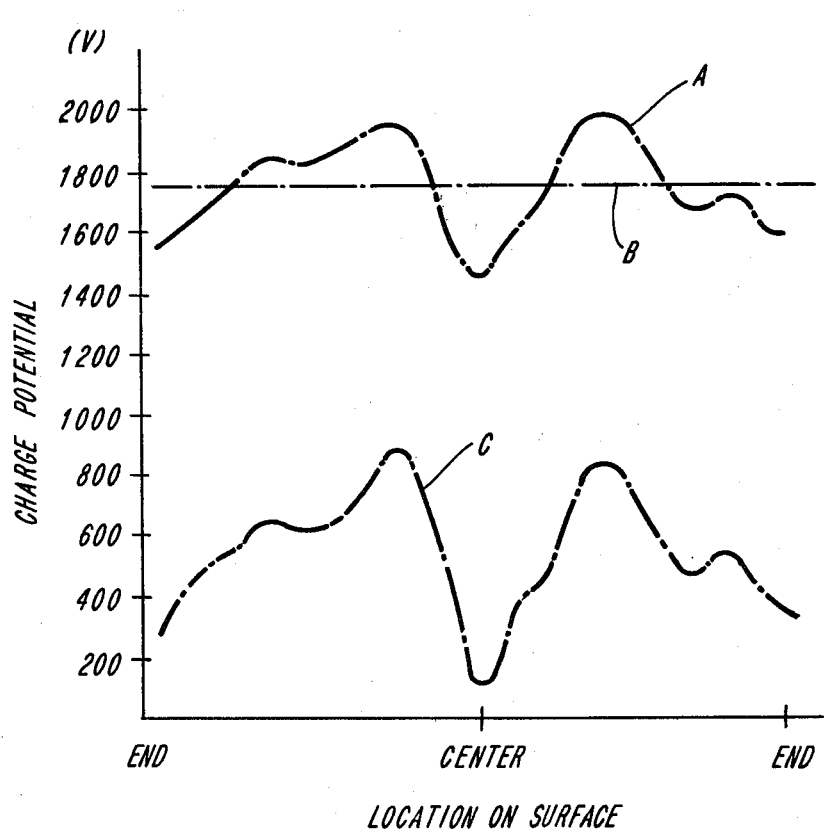

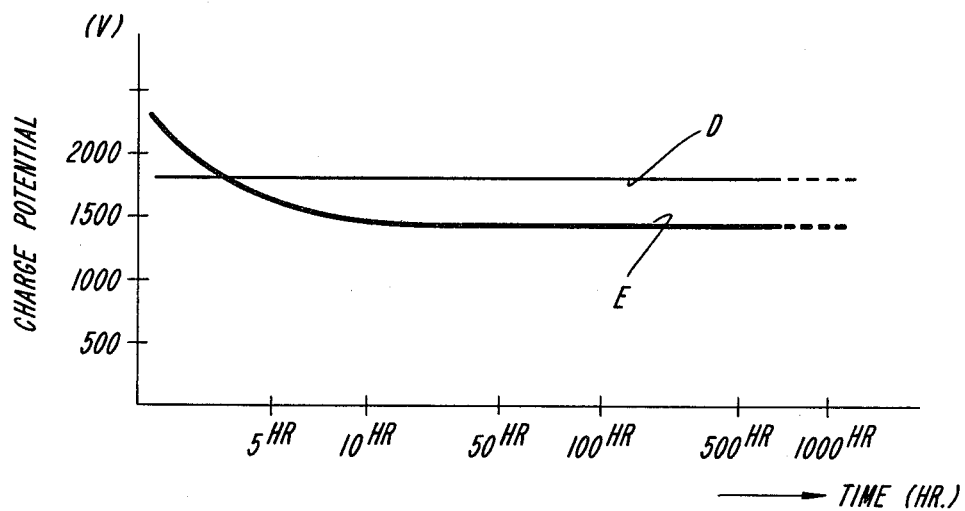
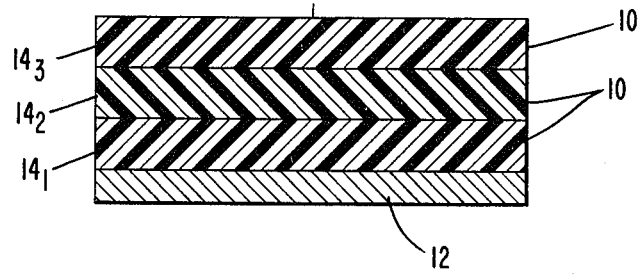
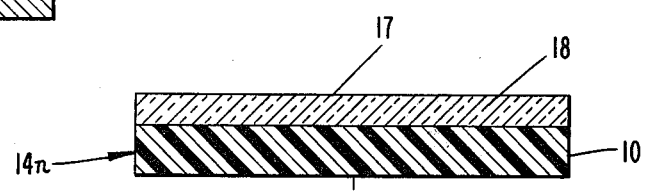
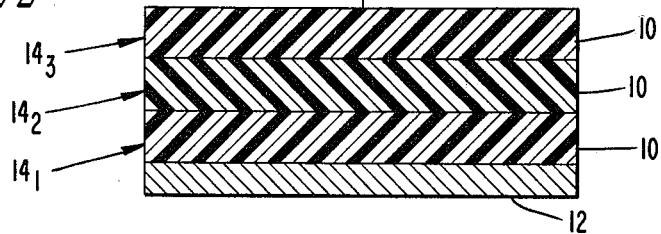

ELECTRET DEVICE

FIELD OF THE INVENTION

This invention relates to an electret device, more particularly to an electret device having an extremely high surface charge potential.

BACKGROUND OF THE INVENTION

An electret is a dielectric body having a high degree of surface electric charge. The electret retains its surface electric charge for a long period of time, often measured in tens of years. The electric charge, or dielectric polarization, is achieved, for example, in one prior art process by heating a body of dielectric material to a relatively high temperature while the material is exposed to an intense electric field for substantial periods of time, and then cooling the material while maintaining its exposure to the electric field. Upon cooling, the material exhibits characteristics of a permanent charge distribution.

Electrets have many uses as a transducer in a device such as a microphone, a loudspeaker and a record disk pick-up. Moreover, it is anticipated that electrets will be used in the near future as memory units, high potential sources, measuring apparatus and the like.

Electrets comprise dielectrics which produce static electric fields having relatively long lifetimes. Their long lifetimes are primarily attributable to the development of new materials which are more stable than previously employed wax materials. Today, plastic materials such as polyethylene, polypropylene and polyethylene terephthalate are extensively used in constructing electrets.

Conventionally, electrets are constructed in the form of electret devices in which an electret body is secured on a conductive electrode. Such electret devices have drawbacks, in that their surface charge potential is relatively low.

SUMMARY OF THE INVENTION

Accordingly, it is an object of the present invention to provide an electret device having a relatively high surface charge potential.

Another object of the present invention is to provide an electret device having an expanded lifetime.

A further object of the present invention is to provide an electret device having a surface charge which can be adjusted to the desired magnitude.

A still further object of the present invention is to provide an electret device having a relatively uniform surface charge distribution.

To achieve the foregoing objects in accordance with the invention as embodied and broadly described herein, the electret device is comprised of a plurality of electret elements formed in stacked layers, with at least one electret element located at the bottom layer of the electret device having a conductive electrode.

Further objects, features and advantages of the present invention will become apparent to persons skilled in the art from a study of the following description of the accompanying drawings, in which:

BRIEF DESCRIPTION OF THE DRAWINGS

FIG. 1 is a sectional view of an electret device constructed according to the present invention.

FIG. 2 is a sectional view of another embodiment of an electret device according to the present invention.

FIG. 3 is a diagram comparing charge potential distributions on a conventional electret device and electret devices of the present invention.

FIG. 4 is a diagram illustrating the charge retention properties of two embodiments of the electret device according to the present invention.

FIGS. 5a and 5b are sectional views of modified embodiments of the electret device according to the present invention.

DESCRIPTION OF THE PREFERRED EMBODIMENT

The present invention will be described in detail with reference to the drawings (FIG. 1 to FIG. 5b). Throughout the drawings, like reference numerals are used to designate like or equivalent portions, for the sake of clarity and simplicity of explanation.

FIG. 1 shows a sectional view of an electret device according to the present invention. Dielectric body 10 is formed in a flat plate-like configuration and provided with a volume of electric charge of a single polarity. Conductive layer or base plate 12 is secured on one flat surface of dielectric body 10.

The combination of polarized dielectric body 10 and conductive base plate 12 forms electret element 14. A plurality of electret elements $14_1$, $14_2$, $14_3$ ... $14_n$ are stacked on each other, with the conductive base plate 12 of one electret element 14 being attached to the dielectric body 10 of another electret element 14 in turn. A stack of electret elements 14 forms one electret device 16, and the base plate 12 of the bottom element 14 serves as a conductive electrode. Each combination of dielectric body 10 and conductive base plate 12 is similar to a conventional electret device.

Typically, the polarization of each dielectric body 10 is carried out by, for example, imposing an electrical field or applying charged particles, e.g., ions, before or after conductive base plate 12 is secured to dielectric body 10. The polarity of dielectric body 10 may be determined by the polarity of the electrical field or the charged particles.

Most dielectric materials are suitable for forming dielectric body 10 in the electret of the present invention. However, high molecular weight compounds such as polypropylene, teflon ® (flourine-containing polymers) or polyethylene, are especially suitable because the electric charge in these materials becomes relatively high in potential and is maintained for a long period of time.

Electret device 16 of FIG. 1 has a very high surface charge potential as a whole. The charge potential $E_s$ is given by the following equation:

$$E_s = [[(E_1 \cdot K_2 + E_2) \cdot K_3 + E_3] \cdot K_4 + \ldots ] \cdot K_n + E_n \quad (1)$$
$$= k_1 \cdot E_1 + k_2 \cdot E_2 + k_3 \cdot E_3 + \ldots + E_n$$

where $E_s$ represents the charge potential of electret device 16 as a whole, $E_1$, $E_2$, $E_3$ ... and $E_n$ represent the charge potentials of electret elements $14_1$, $14_2$, $14_3$ ... $14_n$, respectively, $K_1$, $K_2$, $K_3$ ... and $K_n$ represent polarization constants (as they will be referred to herein) of electret elements $14_1$, $14_2$, $14_3$, ... and $14_n$, and $k_1$, $k_2$, $k_3$ ... represent the respective synthetic polarization constants of electret $14_1$, $14_2$, $14_3$ ... $14_n$. The electret elements located in the lower part of electret device 16 dielectrically affect electret element $14_n$ located at the top of electret device 16, directly or via one or more electret elements therebetween.

It is apparent from Equation (1) that the charge potential $E_s$ of electret device 16 is exceedingly higher than that of the individual electret elements 14. Therefore, the electret device 16 described above is very useful in many fields. For example, an electrostatic transducer in a device such as a microphone or a headphone using the electret device 16 of the present invention is highly sensitive and has other desirable properties. Specifically powerful electrostatic loudspeakers which were difficult to realize utilizing prior art electret devices may be constructed using electret device 16.

FIG. 2 shows a sectional view of an electret device of another embodiment according to the present invention. Electret device 16 as shown in FIG. 2 is different from electret device 16 of FIG. 1 in that it possesses a cover body 18 on top of the uppermost electret element $14_n$.

Cover body 18 may be formed from a material selected from any conductive, semi-conductive or non-conductive material, or mixtures thereof, and/or mixed with other substances. For example, non-conductive materials such as glass or organic compounds having a volume resistivity of more than $10^{12}\Omega$-cm are particularly suitable.

In the electret device 16 described above, cover body 18 is polarized dielectrically under the effect of charged dielectric body 10. A positive polarity appears on cover body 18 at its outer surface 17, apart from electret element $14_n$, if the polarity of the charge of dielectric body 10 is positive, and vice versa. That is, a polarity which is the same as the polarity of the surface charge of dielectric body 10 appears on the outer surface 17 of cover body 18.

The charge potential $E_{sc}$ is given by the following equation:

$$E_{sc} = [[[(E_1 \cdot K_2 + E_2) \cdot K_3 + E_3] \cdot K_4 + \ldots ] \cdot K_n + E_n] \cdot K_C \\ = k_1 \cdot E_1 + k_2 \cdot E_2 + k_3 \cdot E_3 + \ldots + K_C E_n \quad (2)$$

where $K_c$ represents the polarization constant of the material of cover body 18, and the other elements of the equation are identical with the corresponding letters in Equation (1) discussed earlier herein, except that $k_1, k_2, k_3 \ldots$ refer, in this equation, to cover body 18, not the electret element $14_n$ located at the top of electret device 16.

The charge potential $E_{sc}$ of electret device 16 of FIG. 2 is also exceedingly higher than the individual electret elements 14, as with the electret device 16 shown in FIG. 1. Further, the charge potential $E_{sc}$ is uniform at every part of the upper surface of cover body 18, as will be explained below.

FIG. 3 shows a diagram comparatively illustrating the potential distribution characteristics of electret devices 16 constructed according to the present invention and a conventional electret device. Graphs A and B show the potential distribution characteristics of electret devices 16 of FIG. 1 and FIG. 2 respectively, wherein the number of electret elements 14 is three, and graph C shows the potential distribution characteristics of a conventional electret device similar in its size to those of the present invention.

As may be seen from Graphs A and B, the charge potentials or their average values, for electret devices 16 constructed according to the present invention are nearly three times that of a conventional electret device, as shown in graph C. The charge potential dispersion shown in graph A, when evaluated in terms of a ratio to its average potential, is smaller than that of graph C. Furthermore, the charge potential illustrated in graph B shows little dispersion whatsoever. As may be seen from the relatively flat characteristics of graph A and the very flat characteristics of graph B, an electret device 16 according to the present invention exhibits an exceedingly uniform surface charge at every part of its upper surface. On the other hand, as the conventional electret device described above does not exhibit a uniform surface charge as may be seen from graph C.

Electret device 16 of the present invention, therefore, possesses improved usefulness. For example, transducers using electret device 16 of the present invention can provide high efficiency transducing characteristics due to the high surface charge potential of the electret device. Furthermore, transducers using electret device 16 of the present invention can provide high fidelity transducing characteristics, since the electrostatic forces arising between electret device 16, as one electrode of a transducing capacitor, and an opposing electrode are uniform at every part of the transducing capacitor.

Electret device 16 according to the present invention exhibits long lived charge or polarization retention properties, since dielectric bodies 10, except for the one located at the top layer of electret device 16 without a cover body, are protected from exposure to the air, and thus the charge becomes hard to drain away from dielectric bodies 10. For example, electret device 16 shown in FIG. 2 is provided with exceedingly long lived charge or polarization retention properties, since the dielectric body 10 of electret element $14_n$ located at the top layer of electret device 16 is protected from being exposed to the air by cover body 18, and thus the charge becomes hard to drain away from this dielectric body.

The charge retention properties of the electret device of the present invention are shown in FIG. 4. Graph D shows the properties of the electret device 16 shown in FIG. 2 having a cover body 18 which is comprised of a conductive material, e.g., a metal. On the other hand, graph E shows the properties of the electret device 16 shown in FIG. 2 having a cover body 18 which is comprised of a non-conductive material, for example, acrylonitrile-butadien styrene (ABS) copolymer. The charge potential shown in graph D is maintained for a long period of time at almost the same value as at the time of its fabrication. While the charge potential shown in graph E gradually decreases after the time of its fabrication, the charge potential approaches steady state around 24 hours afterwards. Then, both of the charge potentials remain at a steady state for a very long period of time.

Furthermore, the surface charge of an electret device 16 having a cover body 18 made of a conductive material may be easily increased after it diminishes by merely supplying a high voltage potential between conductive base plate 12 and conductive cover body 18, since dielectric body 10 will be repolarized by the high voltage potential.

FIGS. 5a and 5b show sectional views of additional modifications of the electret device 16 shown in FIGS. 1 and 2. In these modifications, electret element $14_1$ located at the bottom layer of electret device 16 is provided with a polarized dielectric body 10 and a conductive base plate 12. However, the remaining stacked elements $14_2$, $14_3$ ... $14_n$ are provided with polarized dielectric bodies 10 only, i.e., without base plates.

What is claimed is:

1. An electret device comprising:
a plurality of electret elements formed in stacked layers upon each other, wherein at least the electret element located at the bottom layer comprises a polarized dielectric body situated adjacent to the electret element in the succeeding layer and a conductive electrode secured to the bottom surface of said dielectric body, each electret element having a volume of surface charge of a single polarity, and a cover body constructed of a conductive material attached to the top surface of the electret element located at the top layer of said stack.

2. An electret device comprising:
a plurality of electret elements formed in stacked layers upon each other wherein at least the electret element located at the bottom layer comprises a polarized dielectric body situated adjacent to the electret element in the succeeding layer and a conductive electrode secured to the bottom surface of said dielectric body, each electret element having a volume of surface charge of a single polarity, and a cover body constructed of a semi-conductor material attached to the top surface of the electret element located at the top layer of said stack.

3. An electret device according to claims 1 or 2, wherein each electret element comprises a polarized dielectric body and a conductive base plate secured thereto, each of said dielectric bodies being situated adjacent to the conductive base plate in the succeeding layer, and wherein the base plate of the electret element located at the bottom layer comprises said conductive electrode.

4. An electret device according to claims 1 or 2, wherein each electret element, except the element located at the bottom layer, comprises a polarized dielectric body.

* * * * *